(12) United States Patent
Chang et al.

(10) Patent No.: US 12,453,149 B2
(45) Date of Patent: Oct. 21, 2025

(54) FABRICATING METHOD OF SEMICONDUCTOR DEVICE

(71) Applicant: UNITED MICROELECTRONICS CORP., Hsin-Chu (TW)

(72) Inventors: Chia-Hua Chang, Kaohsiung (TW); Jian-Feng Li, Tainan (TW); Hsiang-Chieh Yen, Penghu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/632,253

(22) Filed: Apr. 10, 2024

(65) Prior Publication Data
US 2024/0258378 A1  Aug. 1, 2024

Related U.S. Application Data

(62) Division of application No. 17/234,731, filed on Apr. 19, 2021, now Pat. No. 11,990,518.

(30) Foreign Application Priority Data

Mar. 5, 2021  (CN) .......................... 202110243882.4

(51) Int. Cl.
*H01L 29/15* (2006.01)
*H01L 21/02* (2006.01)
(Continued)

(52) U.S. Cl.
CPC ... *H10D 62/8171* (2025.01); *H01L 21/02458* (2013.01); *H01L 21/02507* (2013.01);
(Continued)

(58) Field of Classification Search
CPC ............ H10D 62/8171; H10D 30/015; H10D 30/475; H10D 62/824; H10D 62/8503;
(Continued)

(56) References Cited

U.S. PATENT DOCUMENTS 4,261,771 A * 4/1981 Dingle ............... H10D 62/8164
117/936
4,591,889 A    5/1986 Gossard
(Continued)

FOREIGN PATENT DOCUMENTS

CN    110783167    2/2020
CN    111146269    5/2020
(Continued)

*Primary Examiner* — Jay C Kim
(74) *Attorney, Agent, or Firm* — Winston Hsu

(57) ABSTRACT

The present disclosure provides a semiconductor device and a fabricating method thereof, the semiconductor device including a substrate, a nucleation layer, a buffer layer, an active layer and a gate electrode. The nucleation layer is disposed on the substrate, and the buffer layer is disposed on the nucleation layer, wherein the buffer layer includes a first superlattice layer having at least two heteromaterials alternately arranged in a horizontal direction, and a second superlattice layer having at least two heteromaterials vertically stacked along a vertical direction. The at least two heteromaterials stack at least once within the second superlattice layer. The active layer is disposed on the buffer layer, and the gate electrode is disposed on the active layer.

6 Claims, 8 Drawing Sheets

(51) Int. Cl.
  *H01L 21/306* (2006.01)
  *H10D 30/01* (2025.01)
  *H10D 30/47* (2025.01)
  *H10D 62/815* (2025.01)
  *H10D 62/824* (2025.01)
  *H10D 62/85* (2025.01)

(52) U.S. Cl.
  CPC .... *H01L 21/0254* (2013.01); *H01L 21/30625* (2013.01); *H10D 30/015* (2025.01); *H10D 30/475* (2025.01); *H10D 62/824* (2025.01); *H10D 62/8503* (2025.01)

(58) Field of Classification Search
  CPC ............. H10D 62/8181; H10D 62/343; H10D 62/8161; H10D 84/406; H10D 84/87; H10D 30/605; H01L 21/02458; H01L 21/02507; H01L 21/0254; H01L 21/30625; H10H 29/856; H10H 29/8581; H10H 20/818
  See application file for complete search history.

(56) References Cited

U.S. PATENT DOCUMENTS

| | | | |
|---|---|---|---|
| 4,792,832 A * | 12/1988 | Baba | H10D 62/8162 257/E29.247 |
| 4,855,797 A * | 8/1989 | Kohn | H10D 30/4732 257/656 |
| 4,857,971 A | 8/1989 | Burnham | |
| 4,872,038 A | 10/1989 | Bernstein | |
| 4,937,204 A * | 6/1990 | Ishibashi | H10D 10/881 148/DIG. 72 |
| 4,983,540 A * | 1/1991 | Yamaguchi | H01L 21/2633 438/10 |
| 4,987,094 A * | 1/1991 | Colas | H01L 21/02546 257/E21.123 |
| 5,013,683 A | 5/1991 | Petroff | |
| 5,054,030 A | 10/1991 | Sakaki | |
| 5,057,880 A | 10/1991 | Eshita | |
| 5,070,375 A * | 12/1991 | Sakai | H01L 29/158 257/15 |
| 5,126,804 A * | 6/1992 | Nagai | B65D 83/53 372/46.01 |
| 5,166,100 A | 11/1992 | Gossard | |
| 5,198,879 A | 3/1993 | Ohshima | |
| 5,212,404 A * | 5/1993 | Awano | H10D 62/221 257/E29.05 |
| 5,238,869 A | 8/1993 | Shichijo | |
| 5,294,807 A * | 3/1994 | Ugajin | B82Y 20/00 257/17 |
| 5,298,108 A | 3/1994 | Miller | |
| 5,302,840 A * | 4/1994 | Takikawa | H10D 84/85 257/11 |
| 5,436,468 A | 7/1995 | Nakata | |
| 5,458,084 A * | 10/1995 | Thorne | G21K 1/062 117/89 |
| 5,523,585 A * | 6/1996 | Nakamura | H01L 29/158 257/E29.05 |
| 5,559,343 A | 9/1996 | Kiehl | |
| 5,608,231 A * | 3/1997 | Ugajin | H10D 30/00 257/27 |
| 5,719,407 A * | 2/1998 | Ugajin | B65D 83/53 257/17 |
| 5,905,297 A | 5/1999 | Mori | |
| 5,932,889 A * | 8/1999 | Matsumura | H10D 30/472 257/E29.301 |
| 5,959,308 A | 9/1999 | Shichijo | |
| 6,078,062 A | 6/2000 | Kuramoto | |
| 6,121,121 A | 9/2000 | Koide | |
| 6,177,684 B1 | 1/2001 | Sugiyama | |
| 6,498,048 B2 | 12/2002 | Morita | |
| 6,521,961 B1 | 2/2003 | Costa | |
| 6,599,362 B2 | 7/2003 | Ashby | |
| 6,600,169 B2 | 7/2003 | Stintz | |
| 6,645,295 B1 | 11/2003 | Koike | |
| 7,141,444 B2 | 11/2006 | Koike | |
| 7,244,308 B2 | 7/2007 | Morita | |
| 7,285,378 B2 * | 10/2007 | Martrou | H01L 21/0243 430/313 |
| 7,462,867 B2 | 12/2008 | Tezen | |
| 7,815,970 B2 | 10/2010 | Schlesser | |
| 7,829,900 B2 | 11/2010 | Hata | |
| 8,039,329 B2 | 10/2011 | Nakazawa | |
| 8,115,224 B2 | 2/2012 | Kim | |
| 8,137,998 B2 | 3/2012 | Yan | |
| 8,179,938 B2 | 5/2012 | Kim | |
| 8,652,947 B2 | 2/2014 | Wang | |
| 8,993,416 B2 | 3/2015 | Yui et al. | |
| 9,012,306 B2 | 4/2015 | Beaumont | |
| 9,147,615 B2 | 9/2015 | Afzali-Ardakani | |
| 9,202,906 B2 | 12/2015 | Howell | |
| 9,240,449 B2 | 1/2016 | Chang | |
| 9,263,635 B2 | 2/2016 | Tu | |
| 9,396,941 B2 | 7/2016 | Hite | |
| 9,466,679 B2 | 10/2016 | Stewart | |
| 9,773,897 B2 | 9/2017 | Nechay | |
| 10,325,982 B1 | 6/2019 | Chang | |
| 10,879,382 B1 | 12/2020 | Chang | |
| 10,985,271 B2 | 4/2021 | Yang | |
| 11,081,579 B2 | 8/2021 | Chang | |
| 11,171,203 B2 * | 11/2021 | Zhang | H10D 62/111 |
| 11,239,327 B2 | 2/2022 | Lee | |
| 11,264,492 B2 | 3/2022 | Huang | |
| 11,296,214 B2 | 4/2022 | Lee | |
| 2009/0001441 A1 | 1/2009 | Jin | |
| 2009/0032802 A1 | 2/2009 | Droopad | |
| 2013/0140525 A1 | 6/2013 | Chen | |
| 2015/0349064 A1 * | 12/2015 | Azize | H10D 30/015 438/478 |

FOREIGN PATENT DOCUMENTS

| | | | |
|---|---|---|---|
| JP | 7-297144 | 11/1995 | |
| JP | 2015-60883 | 3/2015 | |
| WO | WO 2015/054982 A1 * | 4/2015 | ............ H01L 29/778 |

\* cited by examiner

FABRICATING METHOD OF SEMICONDUCTOR DEVICE

CROSS REFERENCE TO RELATED APPLICATIONS

This application is a division of U.S. application Ser. No. 17/234,731, filed on Apr. 19, 2021. The content of the application is incorporated herein by reference.

BACKGROUND OF THE INVENTION

1. Field of the Invention

The present disclosure relates to a semiconductor device and a fabricating method thereof, and more particularly, to a semiconductor device having a high electron mobility transistor (HEMT) and a fabricating method thereof.

2. Description of the Prior Art

In semiconductor technology, group III-V semiconductor compounds may be used to form various integrated circuit (IC) devices, such as high power field-effect transistors (FETs), high frequency transistors, or high electron mobility transistors (HEMTs). In the high electron mobility transistors, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2 DEG) may be generated by the piezoelectricity property of the GaN-based materials, and the switching velocity may be enhanced because of the higher electron velocity and the higher electron density of the two-dimensional electron gas. However, with the upgrading of electronic products, the structure and fabrication of the general high electron mobility transistors need to be further improved to meet the industrial requirements to gain diverse functionality.

SUMMARY OF THE INVENTION

One of the objectives of the present disclosure provides a semiconductor device and a fabricating method thereof. In the semiconductor device, a superlattice layer arranged in a horizontal direction and a superlattice layer arranged in a vertical direction are simultaneously disposed over the nucleation layer, to prevent lattice defects from extending or diffusing upwardly. Thus, the semiconductor device of the present disclosure may significantly improve the defects of gallium nitride based material layers caused by lattice mismatch and/or thermal expansion coefficient mismatch, thereby improving device reliability and overall performances.

To achieve the purpose described above, one embodiment of the present disclosure provides a semiconductor device including a substrate, a nucleation layer, a buffer layer, an active layer and a gate electrode. The nucleation layer is disposed on the substrate, and the buffer layer is disposed on the nucleation layer, wherein the buffer layer includes a first superlattice layer having at least two heteromaterials alternately arranged in a horizontal direction, and a second superlattice layer having at least two heteromaterials vertically stacked along a vertical direction. The at least two heteromaterials stack at least once within the second superlattice layer. The active layer is disposed on the buffer layer, and the gate electrode is disposed on the active layer.

To achieve the purpose described above, one embodiment of the present disclosure provides a method of forming a semiconductor device including the following steps. Firstly, a substrate is provided, and a nucleation layer is formed on the substrate. Next, a buffer layer is formed on the nucleation layer, and the buffer layer includes a r having at first superlattice layer least two heteromaterials alternately arranged in a horizontal direction, and a second superlattice layer having at least two heteromaterials vertically stacked along a vertical direction. The at least two heteromaterials stack at least once within the second superlattice layer. Then, an active layer is formed on the buffer layer, and a gate electrode is formed on the active layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-4 are schematic diagrams illustrating a semiconductor device according to a second embodiment in the present disclosure, wherein:

FIG. 2 shows a cross-sectional view of a semiconductor device;

FIG. 3 shows a top view of a first superlattice layer of a semiconductor device; and FIG. 4 shows another top view of a first superlattice layer of a semiconductor device.

FIGS. 5-7 are schematic diagrams illustrating a fabricating method of a semiconductor device according to one embodiment in the present disclosure, wherein:

FIG. 5 shows a cross-sectional view of a semiconductor device after forming openings;

FIG. 6 shows a cross-sectional view of a semiconductor device after forming a material layer to fill up the openings;

FIG. 7 shows a cross-sectional view of a semiconductor device after performing a planarization process.

DETAILED DESCRIPTION

To provide a better understanding of the presented disclosure, preferred embodiments will be described in detail.

The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
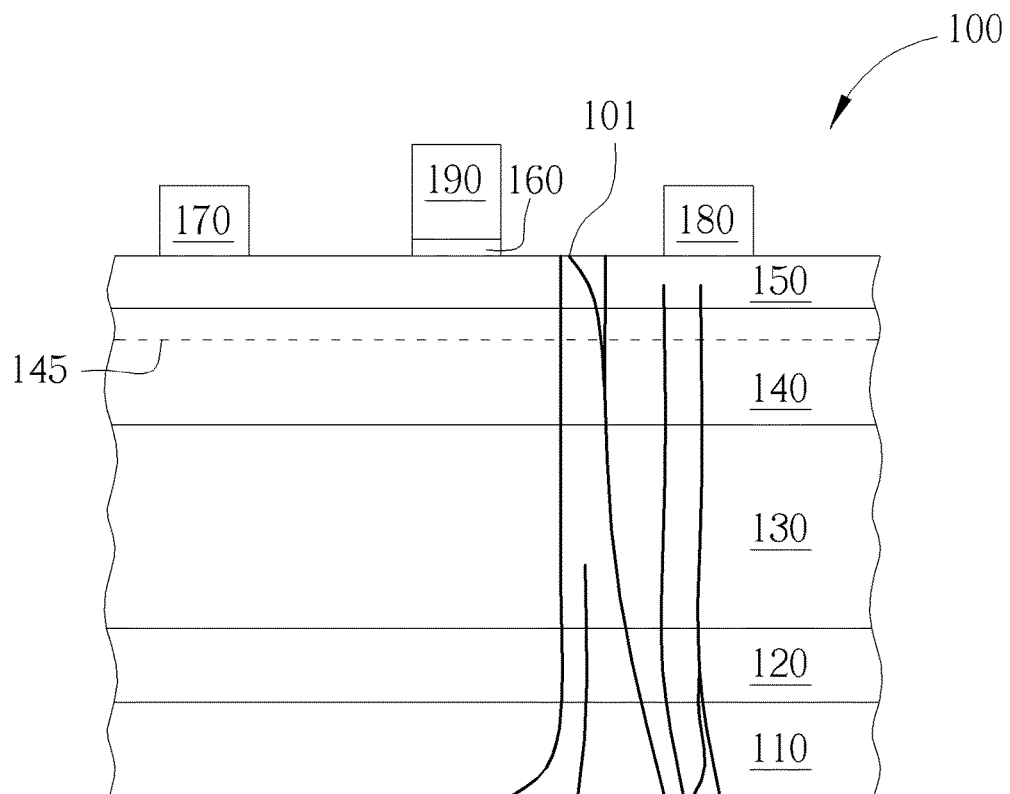
FIG. 1 is a schematic diagram illustrating a cross-sectional view of a semiconductor device according to a first embodiment in the present disclosure.

Please refer to FIG. 1, which illustrates a cross-sectional view of a semiconductor device 100 according to a first embodiment of the present disclosure. The semiconductor device 100 includes a substrate 110, and the substrate 110 may be formed by silicon or other semiconductor material. In one embodiment, the substrate 110 may include a silicon layer with <111> lattice structure, but not limited thereto. In another embodiment, the substrate 110 may also include a semiconductor compound such as silicon carbide (Sic), gallium arsenide (GaAs), indium arsenide (InAs) or indium phosphide (InP), or a semiconductor alloy such as silicon germanium (SiGe), silicon germanium carbide (SiGeC), gallium arsenide phosphide (AsGaP) or indium gallium phosphide (InGaP).

Then, a channel layer 140 and a barrier layer 150 are sequentially formed on the substrate 110. The channel layer 140 and the barrier layer 150 may respectively include different III-V materials, so that, a heterojunction may be formed between the channel layer 140 and the barrier layer 150, thereby leading to discontinuous band-gaps. In the present disclosure, a "III-V material" refers to a semiconductor compound which includes at least one group III element or at least one group V element, where the group III element may be boron (B), aluminum (Al), gallium (Ga) or indium (In), and the group V element may be nitrogen (N), phosphorous (P), arsenic (As), or antimony (Sb). Also, in the present embodiment, the channel layer 140 and the barrier layer 150 may together serve as an active layer, wherein the barrier layer 150 may include aluminum gallium nitride ($Al_{x1}Ga_{1-x1}N$, with $x1$ being a constant greater than 0 and less than 1, $0<x1<1$), the channel layer 140 may include gallium nitride (GaN), and the band-gap of the barrier layer 150 is greater than the band-gap of the channel layer 140. Accordingly, the electron of the barrier layer 150 generated by the piezoelectricity may fall in the channel layer 140, thereby forming a high mobility electron film namely a two-dimensional electron gas (2 DEG) 145 within the channel layer 140 and adjacent to the barrier layer 150, as shown in FIG. 1.

Furthermore, a P-type III-V composition layer 160, a source electrode 170, a drain electrode 180, and a gate electrode 190 are further formed on the barrier layer 150, wherein the gate electrode 190 is disposed on the P-type III-V composition layer 160 and the source electrode 170 and the drain electrode 180 are formed on the barrier layer 150, at two opposite sides of the P-type III-V composition layer 160 and the gate electrode 190, respectively. Precisely speaking, the P-type III-V composition layer 160 is disposed right below the gate electrode 190, so that, sidewalls of the P-type III-V composition layer 160 may be vertical aligned with two sidewalls of the gate electrode 190, as shown in FIG. 1. In the present embodiment, the P-type III-V composition layer 160 may include but not limited to P-type doped gallium nitride (pGaN), and the gate electrode 190, the source electrode 170, and the drain electrode 180 may include titanium (Ti), aluminum, titanium nitride (TiN), platinum (Pt), gold (Ag), or other suitable conductive materials. Accordingly, the semiconductor device 100 of the present embodiment may include a high electron mobility transistor (HEMT), in which the two-dimensional electron gas 145 within the active layer may become a normally on channel. However, in another embodiment, the P-type III-V composition layer 160 may further include a divalent dopant, such as magnesium (Mg), zinc (Zn), calcium (Ca), beryllium (Be), carbide (C) or iron (Fe). The divalent dopant may occupy the original space of the III-V compound within the active layer which is right below the gate electrode 190, depleting the two-dimensional electron gas 145 to form a normally off channel.

The semiconductor device 100 further includes a nucleation layer 120 and a buffer layer 130 stacked from bottom to top between the substrate 110 and the channel layer 140 to compensating the lattice mismatch and/or the thermal expansion coefficient mismatch between the substrate 110 and the aforementioned stacked layers (including the channel layer 140, the barrier layer 150 and the P-type III-V composition layer 160), so as to provide a better basis for the epitaxial process. The nucleation layer 120 and the buffer layer 130 may respectively include different III-V materials. In the present embodiment, the nucleation layer 120 may include but not limited to gradient distributed aluminum gallium nitride ($Al_{x2}Ga_{1-x2}N$) with $x2$ being a constant greater than or equal to 0, and less than 1, and with $x2$ being gradually decreased from bottom to top. In one embodiment, the nucleation layer 120 and/or the buffer layer 130 may further include a multilayer structure, so that, the lattice structure between the substrate 110 and the stacked layers may gradually modify, thereby gradually improving the compatibility of the lattice structure and the thermal expansion coefficient between the substrate 110 and the stacked layers. Also, in another embodiment, the nucleation layer 120 and the buffer layer 130 may further include a P-type dopant, the P-type dopant may capture the electrons diffused from the substrate 110, to avoid affecting the two-dimensional electron gas 145.

Through these arrangements, the semiconductor device 100 of the present embodiment may gradually improve the compatibility of the lattice structure and the thermal expansion coefficient between the substrate 110 and the stacked layers disposed thereon through disposing the nucleation layer 120 and the buffer layer 130 thus that, the electrical property of the high electron mobility transistor may be enhanced.

However, in some situation, the lattice mismatch and/or thermal expansion coefficient mismatch between the stacked layers may not be successfully eliminated, and which may result in lattice defects 101 as shown in FIG. 1. Also, the lattice defects 101 may further transmit upwardly along the boundary of the stacked layers to cause serious dislocation, fracture, peeling or other issues finally, which may dramatically affect the device quality of the high electron mobility transistor. For overcome the said issues, people skilled in the art may optionally dispose a plurality of protruding epitaxial structures (not shown in the drawings), or a whole layer or a bulk-shaped insulating mask (for example the $SiO_2$/SiN nanomask, not shown in the drawings) in the substrate 110 or in the nucleation layer 120 for blocking the transmission of the lattice defects 101. However, the protruding epitaxial structures are usually the stress-released points of a structure, and the protruding epitaxial structures may easily lead to additional structural defects while a heating change is occurred during the fabricating process. On the other hand, the whole layered or the bulk-shaped insulating mask are less efficiently in blocking the upward transmission of the lattice defects 101, and which is still poorly improve the reliability of the device.

Thus, people well known in the arts should easily realize the semiconductor device and the fabricating method thereof in the present disclosure is not limited to the aforementioned embodiment, and may further include other examples or variety. The following description will detail the different embodiments of the semiconductor device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
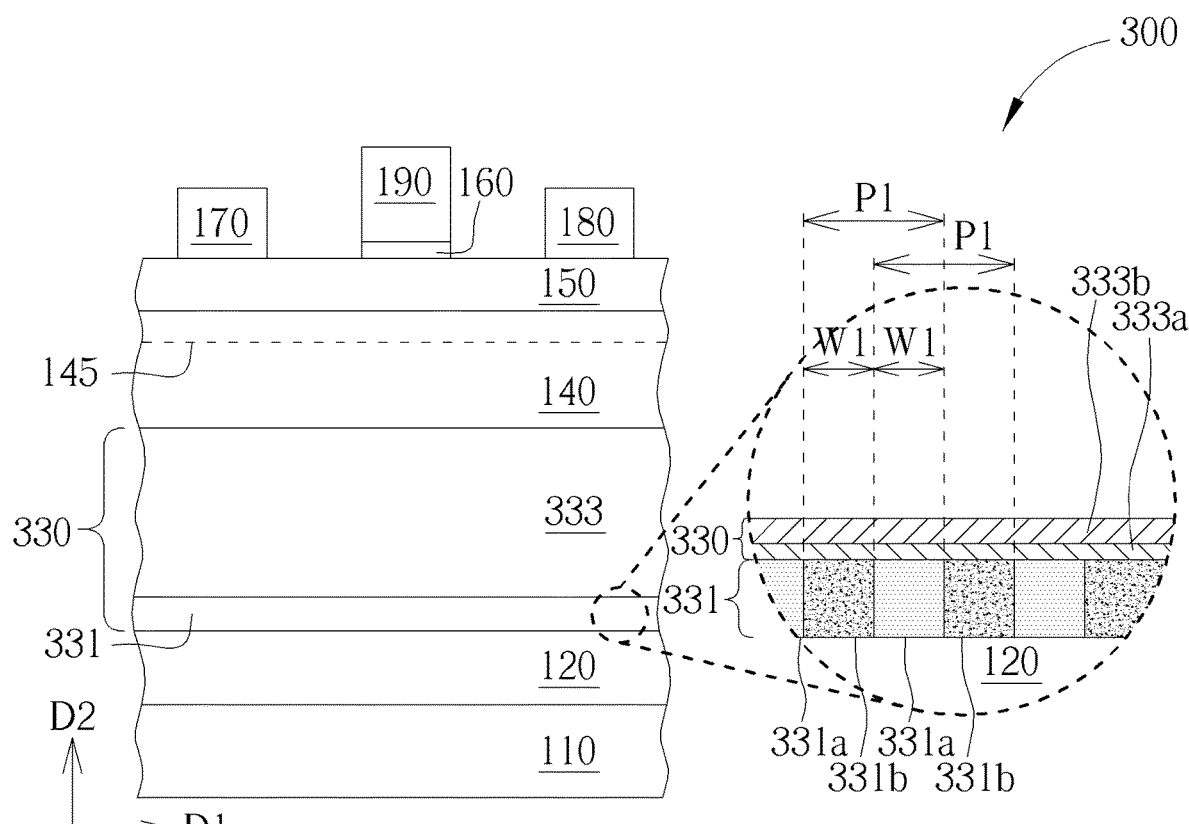

Please refer to FIG. 2, which illustrates a cross-sectional view of a semiconductor device 300 according to the second embodiment of the present disclosure. The structure of the semiconductor device 300 is substantially similar to that in the aforementioned embodiment shown in FIG. 1 and which also includes the substrate 110, the nucleation layer 120, the channel layer 140, the barrier layer 150, the P-type III-V composition layer 160, the source electrode 170, the drain electrode 180, and the gate electrode 190. All similarity between the present embodiment and the aforementioned embodiment will not be redundant described hereinafter. The difference between the present embodiment and the aforementioned embodiment is in that the buffer layer 330 simultaneously includes two or more than two heteromaterials continuously and alternately arranged in a horizontal direction D1, and two or more than two heteromaterials staked on the nucleation layer 120 at least once in a vertical direction D2, such as a first superlattice layer 331 and a second superlattice layer 333 shown in FIG. 2.

Figure 3:
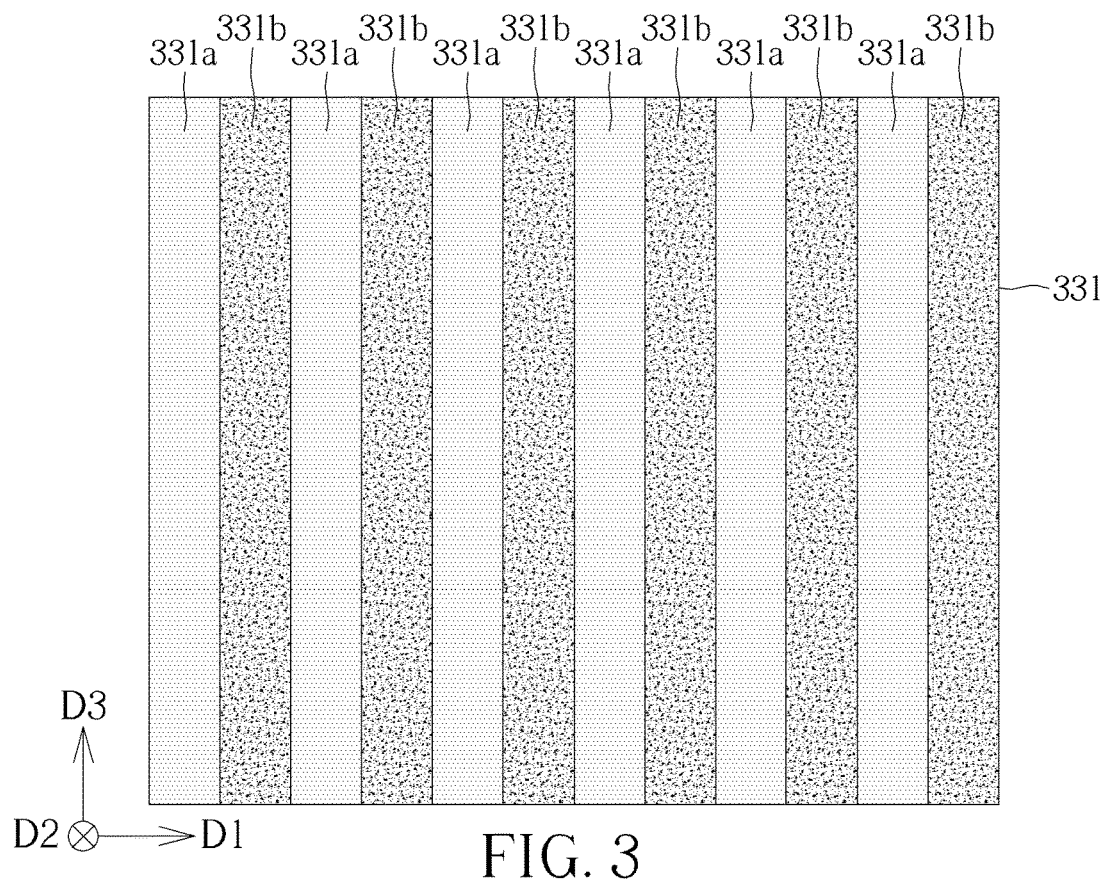
Figure 4:
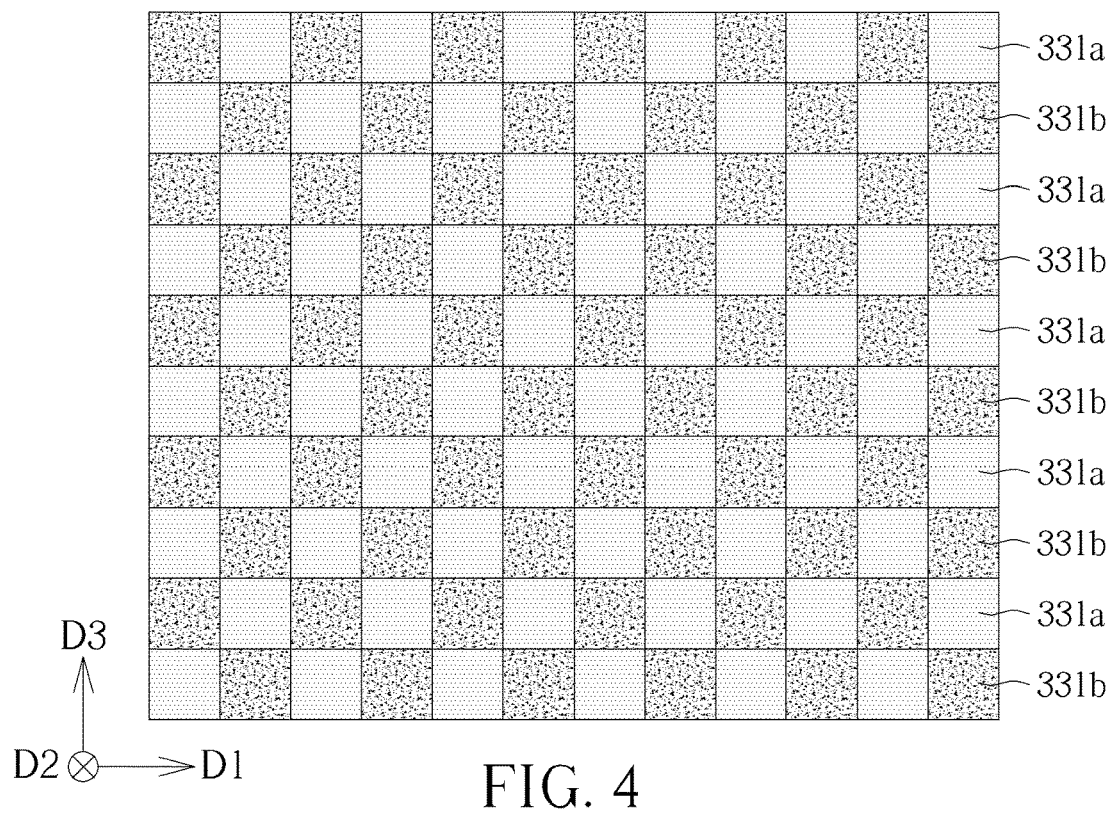

Precisely speaking, the first superlattice layer 331 for example includes two heteromaterials sequentially and repeatedly arranged in the horizontal direction D1, such as the first material 331a and a second material 331b, and the first material 331a and the second material 331b include different compounds with different components. In other words, the first material 331a and the second material 331b are repeatedly arranged within the first superlattice layer 331 by repeating disposing the first material 331a followed by disposing the second material 331b. While being viewed from a cross-sectional view shown in FIG. 2, each of the first materials 331a and the second materials 331b may include a square shape. However, if being viewed from a top view as shown in FIG. 3, each of the first materials 331a and the second materials 331b may include a stripe-shaped structure, with these stripe-shaped structures being parallel extending along a same direction D3. Otherwise, if being viewed from a top view as shown in FIG. 4, each of the first materials 331a and the second materials 331b may include a square-shaped structure, with these square-shaped structures alternately arranged along the horizontal direction D1 and the direction D3 to perform a checkerboard array or the like, but is not limited thereto. Also, people in the art should fully understand that in the embodiment with the first superlattice layer having more than two heteromaterials, the top view of the first superlattice layer may include further complex arrangements, so that, each of the heteromaterials may be allowable to have proper shape, and to properly arranged alternately with each other.

In the present embodiment, the first materials 331a and the second materials 331b for example includes the same sized patterns, such as patterns with the same width W1, for example being about 3 angstrom (Å) to 10 nanometers (nm), but is not limited thereto. Furthermore, the first materials 331a and the second material 331b are arranged along the horizontal direction D1 by the same pitch P1. However, people in the art should fully understand that in another embodiment, the first material and the second material may also optionally include different sized patterns and/or are arranged by different pitches due to practical product requirements. For example in one embodiment, if the width W1 of the first material 331a in the horizontal direction D1 is about 3 angstroms to 10 nanometers, a width of the second material 331b in the horizontal direction D1 is but not limited to 3 angstroms to 10 nanometers. The first material 331a and the second materials 331b for example include different III-V nitride materials, wherein a III-V nitride material refers to a compound semiconductor that includes nitrogen and at least one group III element or a compound semiconductor that includes nitrogen and at least one group V element, such as GaN, aluminum nitride (AlN), indium nitride (InN), arsenic nitride (AsN), aluminum gallium nitride ($Al_{x1}Ga_{1-x1}N$, with a1 being a constant greater than 0 and less than 1, $0<_{x1}<$), InGaN, InAlGaN or the like, but is not limited thereto. In a preferably embodiment, the first material 331a may include GaN, and the second material 331b may include aluminum gallium nitride ($Al_{x1}Ga_{1-x1}N$, with $_{x1}$ being a constant greater than 0 and less than 1, $0<_{x1}<1$). Accordingly, a heterojunction may therefore be formed at every single interface between the first material 331a and the second material 331b, wherein the top surfaces of the first material 331a and the second material 331b are coplanar as shown in FIG. 2.

Figure 8:
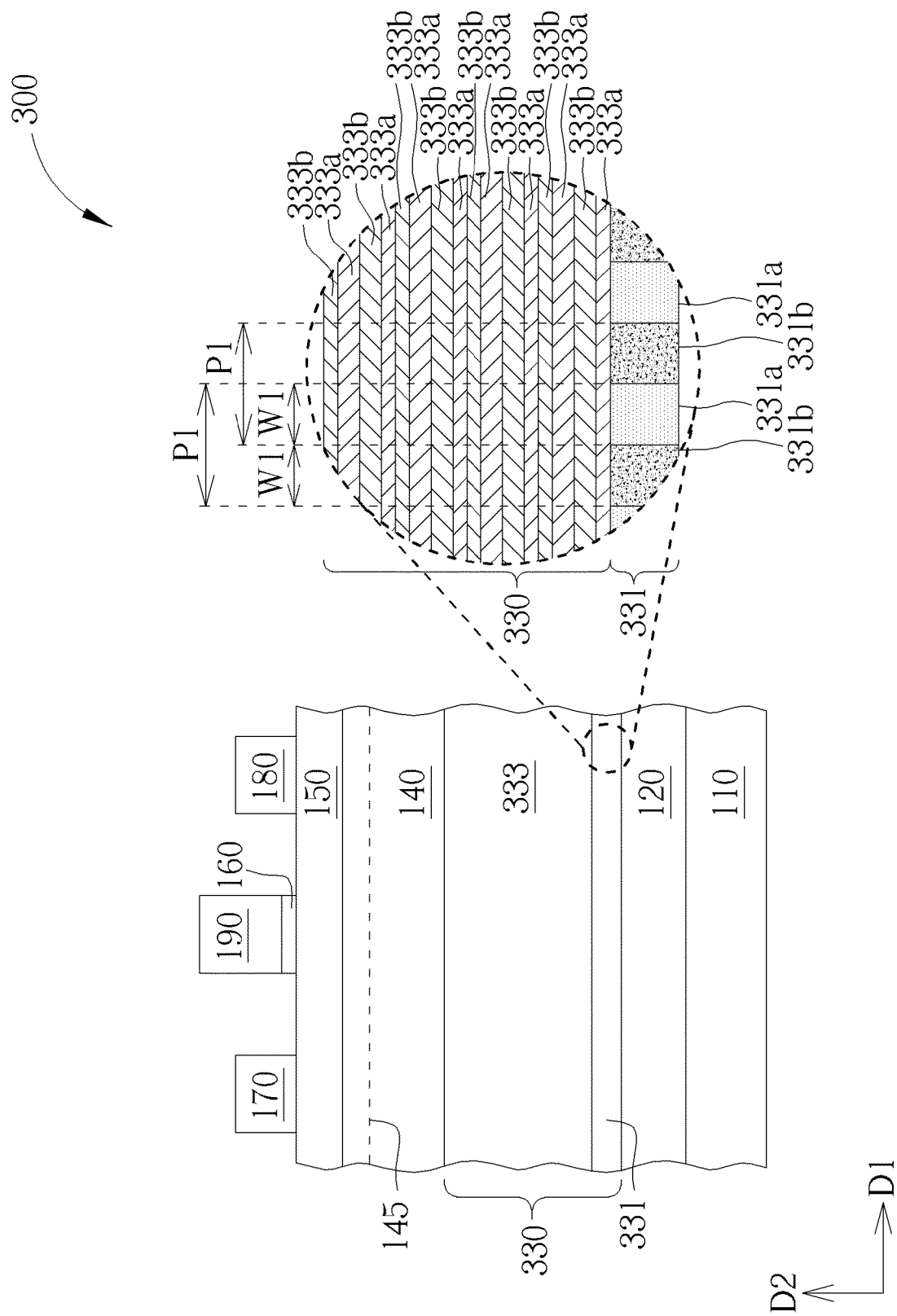
FIG. 8 is a schematic diagram illustrating a cross-sectional view of a semiconductor device according to another embodiment in the present disclosure.

On the other hand, the superlattice layer 333 may include a multilayer structure, and the multilayer structure includes two heteromaterials stacked in the vertical direction D2, such as a third material 333a and a fourth material 333b. The third material 333a and the fourth material 333b may optionally stack in one pair (namely stacked at least once), for example the third material 333a and the fourth material 333b may be disposed within the second superlattice layer by stacking one layer of the fourth material 333b on one layer of the third material 333a. The third material 333a and the fourth material 333b for example include different III-V nitride materials or III-nitride materials. In the present embodiment, the third material 333a may include aluminum gallium nitride ($Al_{x1}Ga_{1-x1}N$, with $_{x1}$ being a constant greater than 0 and less than 1, $0<_{x1}<1$), and the fourth material 333b may include aluminum gallium nitride ($Al_{x3}Ga_{1-x3}N$, with $_{x3}$ being a constant greater than 0 and less than 1, $0<_{x3}<1$), with $_{x3}$ being different from 1, but not limited thereto. People in the art should fully understand that the practical stacked layer number of the multilayer structure may be adjustable due to product requirements. For example, as shown in FIG. 8, the third material 333a and the fourth material 333b may be stacked multiple times, such as being stacked in eight pairs, but is not limited thereto. Accordingly, the third material 333a and the fourth material 333b are disposed within the second superlattice layer 333 in a periodic manner by stacking a layer of the fourth material 333b on a layer of the third material 333a, stacking a layer of the third material 333 on the layer of the fourth material 333b, and then further stacking a layer of the fourth material 333b on the layer of the third material 333, so that, a heterojunction may therefore be formed at the interface of every pair of the third material 333a and the fourth material 333b.

It is noted that, the first superlattice layer 331 and the second superlattice layer 333 are sequentially disposed on the nucleation layer 120, so that, the first superlattice layer 331 may therefore disposed under the second superlattice layer 333, namely at the bottom portion of the buffer layer 330, as show in FIG. 2. Through these arrangements, the laterally arranged first materials 331a and the second material 331b may cause the migration of the lattice defects, and the possible lattice defects within the stacked layers may deviate along the horizontal direction D1, thereby preventing the lattice defects from being transmitted upwardly to damages the integrity and the performance of the device.

In the way, the semiconductor device 300 of the present embodiment may also gradually improve the compatibility of the lattice structure and the thermal expansion coefficient between the substrate 110 and the stacked layers disposed thereon through disposing the nucleation layer 120 and the buffer layer 330. In the buffer layer 330, the first material 331a and the second material 331b are alternately arranged in the horizontal direction D1 and the third material 333a and the fourth material 333b are stacked at least once in the vertical direction D2, so that, the lattice defects in the stacked layers may deviate laterally by two or more than two different heterogeneous materials arranged laterally, thereby eliminating the lattice defects. Accordingly, the possible dislocation, fracture or pealing of the stacked layers may be sufficiently avoided, and the device quality of the high electron mobility transistor may be significantly improved. Then, the semiconductor device 300 of the present embodiment may therefore obtain more optimized reliability and device performance.

In order to enable one of ordinary skill in the art to implement the present disclosure, a fabricating method of a semiconductor device of the present disclosure is further described below, and more particularly, to the fabrication of the first superlattice layer.

Figure 5:
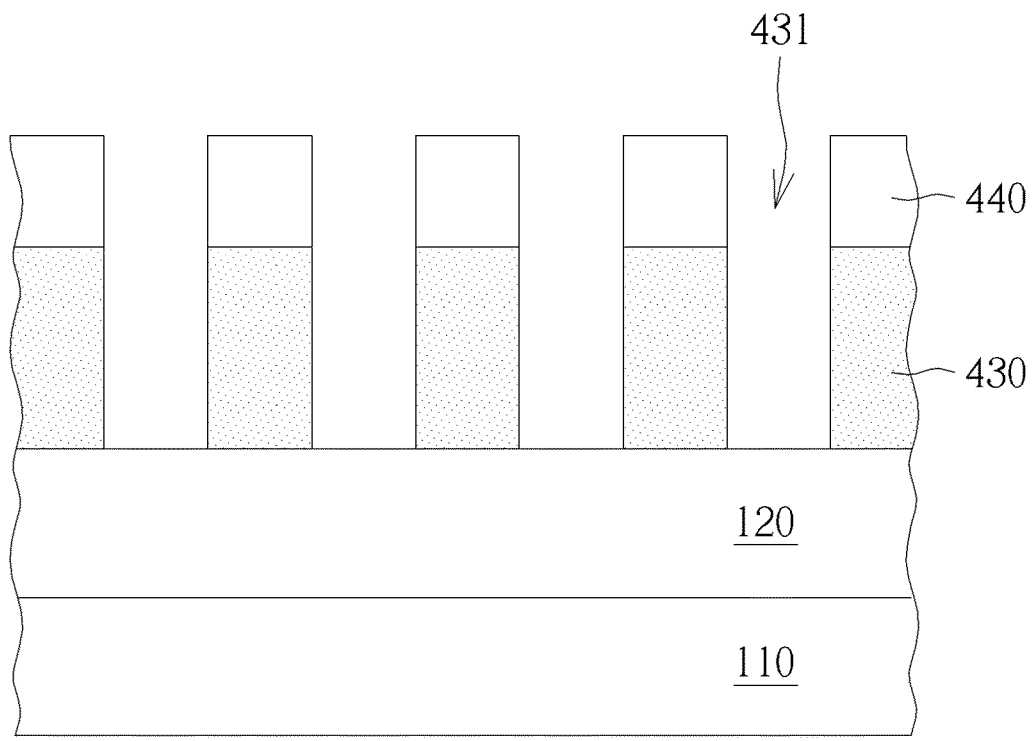
Figure 6:
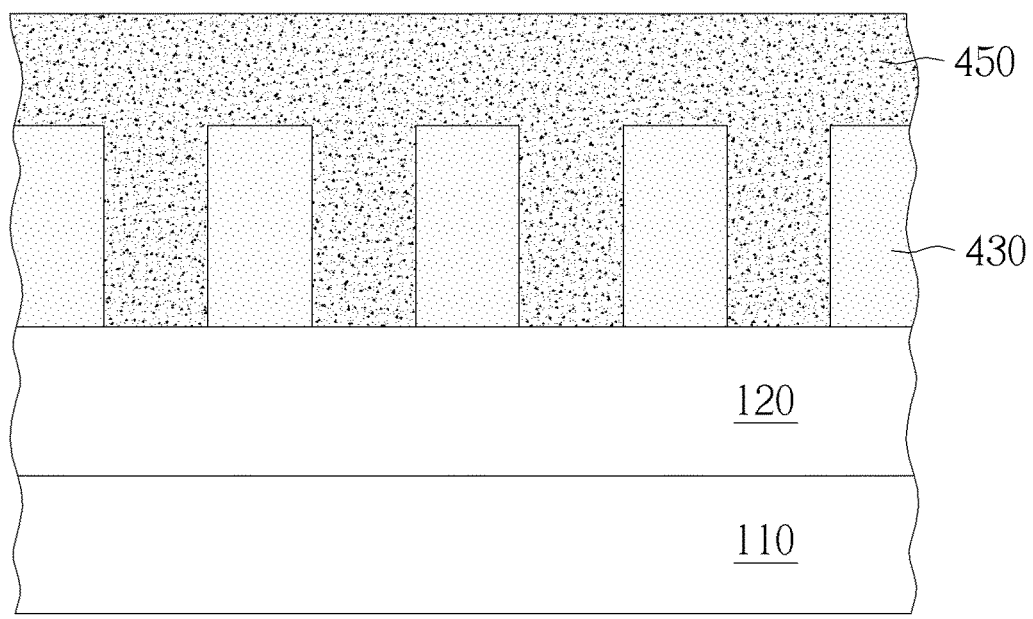
Figure 7:
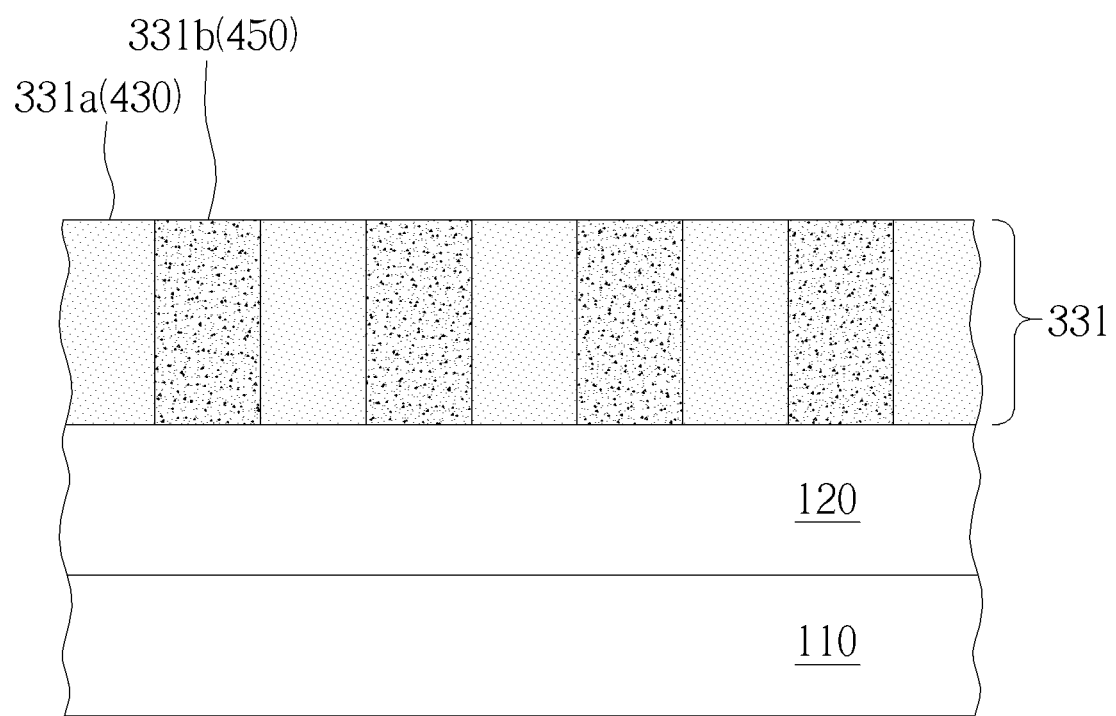

Please refer to FIGS. 5-7, which illustrate a fabricating method of a semiconductor device according to one embodiment in the present disclosure. Firstly, as shown in FIG. 5, the substrate 1a0 is provided, and the nucleation layer 120 and a material layer 430 is sequentially formed on the substrate 110, wherein the material layer 430 for example includes a III-V-nitride material or a III-nitride material, such as including GaN, AlN, InN, AsN, aluminum gallium nitride ($Al_{x1}Ga_{1-x1}N$, with $_{x1}$ being a constant greater than 0 and less than 1, $0<_{x1}<1$), InGaN, InAlGaN or the like, but is not limited thereto. In one embodiment, the material layer 430 may be formed through a chemical vapor deposition (CVD) process or a physical vapor deposition (PVD) process, or an epitaxial growth process such as a metal organic chemical vapor deposition (MOCVD) process, a molecular beam epitaxial (MBE) process, a hydride vapor phase epitaxial (HVPE) process or the like, but not limited thereto.

Next, a mask 440 is formed on the material layer 430, and an etching process is performed on the material layer 430 through the mask 440, to form a plurality of openings 431 in the materials layer 430, as shown in FIG. 5. As shown in FIG. 6, the mask 440 is completely removed, and a material layer 450 is formed on the material layer 430, to fill up each of the openings 431 and to further cover on the top surface of the material layer 430. The material layer 450 for example a III-V nitride material which is different from the material of the material layer 430. In one embodiment, the material layer 450 may be formed through a chemical vapor deposition process or a physical vapor deposition process, or an epitaxial growth process such as a metal organic chemical vapor deposition process, a molecular beam epitaxial process, a hydride vapor phase epitaxial process or the like, but not limited thereto.

Then, as shown in FIG. 7, a planarization process, such as a chemical mechanical polishing/planarization process (CMP), an etching process or other suitable semiconductor process, is performed to remove the material layer 450 disposed on the top surface of the material layer 430. Namely, through the planarization process, the material layer 450 disposed outside the openings 431 is completely removed, to only retain the material layer 450 disposed within the openings 431, and also, the top surfaces of the material layer 450 and the material layer 430 may be coplanar with each other. Accordingly, the aforementioned first superlattice layer 331 is formed, and which includes the heteromaterials (for example including the first material 331a and the second material 331b) laterally and alternately arranged, so that, the lattice defects in the stacked layers may deviate laterally, thereby eliminating the lattice defects. People in the art should fully understand that the aforementioned fabrication method is not limited to be applied on forming a superlattice layer (e.g., the first superlattice layer 331) having two heteromaterials arranged repeatedly and alternately, and which may also be applied on forming a superlattice layer having more than two heteromaterials arranged repeatedly and alternately.

Figure 9:
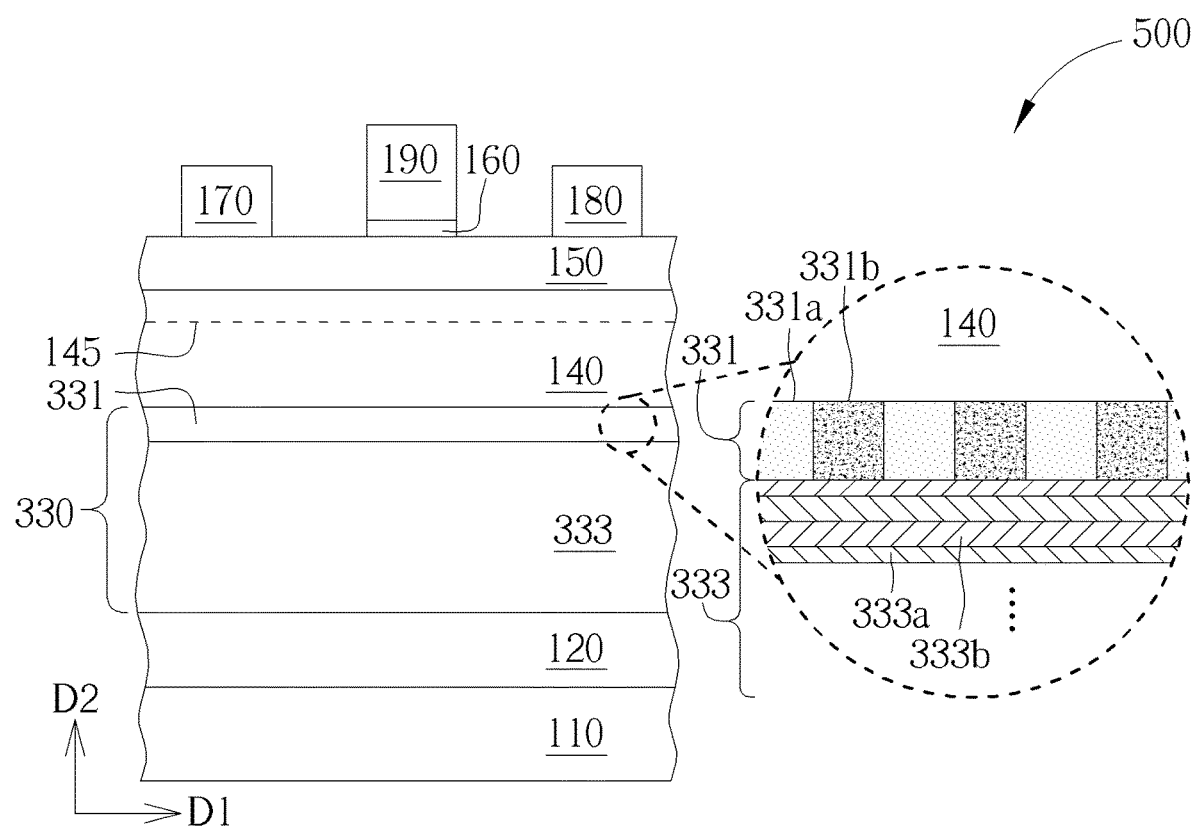
FIG. 9 is a schematic diagram illustrating a cross-sectional view of a semiconductor device according to a third embodiment in the present disclosure.

Please refer to FIG. 9, which illustrates a cross-sectional view of a semiconductor device 500 according to the third embodiment of the present disclosure. The structure of the semiconductor device 500 is substantially similar to that in the aforementioned embodiment shown in FIG. 2 and which also includes the substrate 110, the nucleation layer 120, the channel layer 140, the barrier layer 150, the P-type III-V composition layer 160, the source electrode 170, the drain electrode 180, and the gate electrode 190. All similarity between the present embodiment and the aforementioned embodiment will not be redundant described hereinafter. The difference between the present embodiment and the aforementioned embodiment is in that the first superlattice layer 331 is disposed at the top portion of the buffer layer 330.

Precisely speaking, the second superlattice layer 333 and the first superlattice layer 331 may also be sequentially disposed on the nucleation layer 120, and the second superlattice layer 333 may directly contact to the nucleation layer 120 underneath. Accordingly, the first superlattice layer 331 may therefore be disposed on the top portion of the buffer layer 330, and the lattice defects in the stacked layers may also deviate laterally by the laterally arranged heteromaterials (e.g., the first material 331a and the second material 331b), thereby eliminating the lattice defects. Through these arrangements, the semiconductor device 500 of the present embodiment may also gradually improve the compatibility of the lattice structure and the thermal expansion coefficient between the substrate 110 and the stacked layers disposed thereon through disposing the nucleation layer 120 and the buffer layer 330, and the semiconductor device 500 of the present embodiment may therefore obtain more optimized reliability and device performance.

Figure 10:
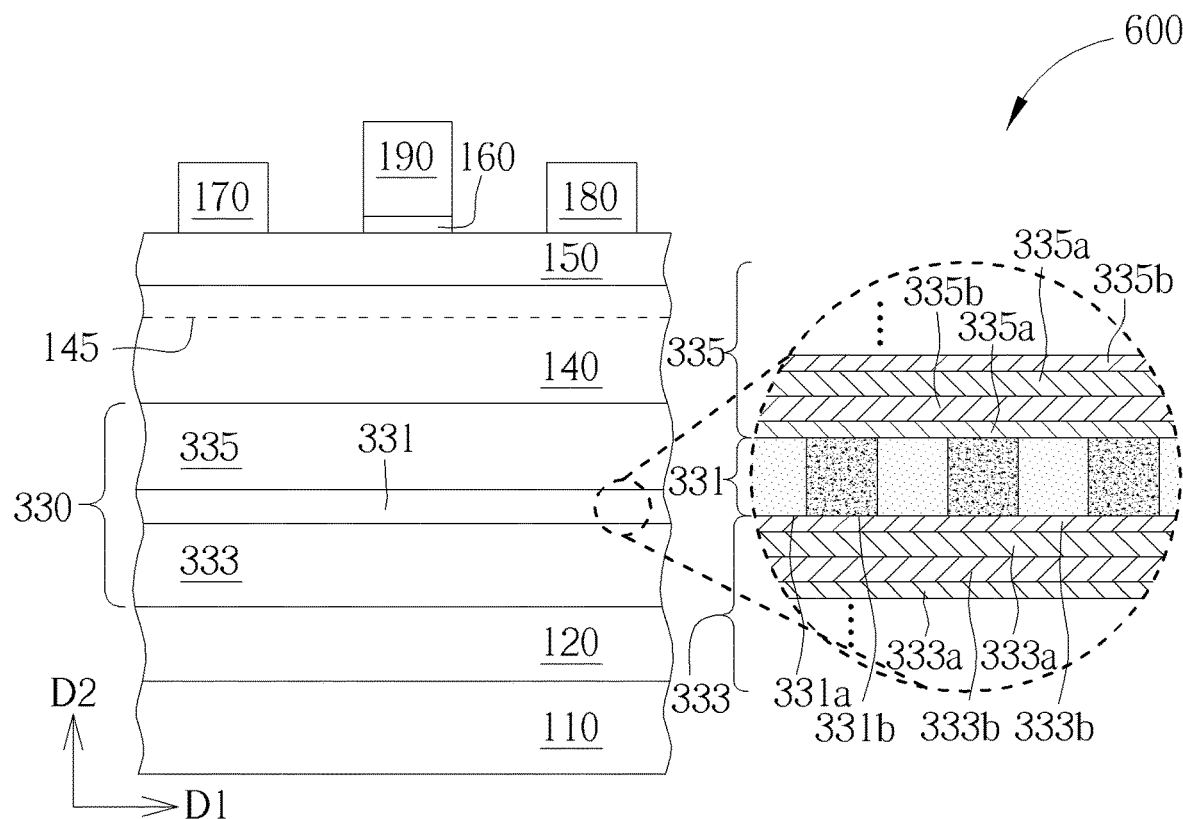
FIG. 10 is a schematic diagram illustrating a cross-sectional view of a semiconductor device according to a fourth embodiment in the present disclosure.

Please refer to FIG. 10, which illustrates a cross-sectional view of a semiconductor device 600 according to the third embodiment of the present disclosure. The structure of the semiconductor device 600 is substantially similar to that in the aforementioned embodiment shown in FIG. 2 and which also includes the substrate 110, the nucleation layer 120, the channel layer 140, the barrier layer 150, the P-type III-V composition layer 160, the source electrode 170, the drain electrode 180, and the gate electrode 190. All similarity between the present embodiment and the aforementioned embodiment will not be redundant described hereinafter. The difference between the present embodiment and the aforementioned embodiment is in that the first superlattice layer 331 is disposed at the middle portion of the buffer layer 330.

Precisely speaking, the buffer layer 330 may further include a third superlattice layer 335, the third superlattice 335 also includes a multilayer structure, and the multilayer structure includes two heteromaterials stacked at least once in the vertical direction D2, such as a fifth material 335a and a sixth material 335b. Likewise, the fifth material 335a and the sixth material 335b are disposed in the third superlattice layer 335 by stacking one layer of the sixth material 335b on one layer of the fifth material 335a for example in one pair, eight pairs or in other number of pairs. People in the art should fully understand that the practical stacked layer number of the multilayer structure may be adjustable due to product requirements. For example, although the fifth material 335a and the sixth material 335b are stacked in two pair in the present embodiment (namely sequentially stacking a layer of the fifth material 335a, a layer of the sixth material 335b, a layer of the fifth material 335a, and a layer of the sixth material 335b), the fifth material 335a and the sixth material 335b may also be stacked in only one pair (namely sequentially stacking a layer of the fifth material 335a and a layer of the sixth material 335b, not shown in the drawings) in the third superlattice layer. Accordingly, a heterojunction may therefore be formed at the interface of every pair of the fifth material 335a and the sixth material 335b. The fifth material 335a and the sixth material 335b for example include different III-V nitride materials or III-nitride materials. In the present embodiment, the fifth material 335a may include aluminum gallium nitride ($Al_{x1}Ga_{1-x1}N$, with $_{x1}$ being a constant greater than 0 and less than 1, $0<_{x1}<1$), and the sixth material 335b may include aluminum gallium nitride ($Al_{x3}Ga_{1-x3}N$, with $_{x3}$ being a constant greater than 0 and less than 1, $0<_{x3}<1$), with $_{x3}$ being different from $_{x1}$, but not limited thereto. Also, the second superlattice layer 333, the first superlattice layer 331 and the third superlattice layer 335 are sequentially disposed on the nucleation layer 120, so that, the first superlattice layer 331 may therefore be disposed between the second superlattice layer 333 and the third superlattice layer 335. Accordingly, the first superlattice layer 331 may therefore be disposed at the middle portion of the buffer layer 330, and the lattice defects in the stacked layers may also deviate laterally by the laterally arranged heteromaterials (e.g., the first material 331a and the second material 331b), thereby eliminating the lattice defects. Through these arrangements, the semiconductor device 600 of the present embodiment may also gradually improve the compatibility of the lattice structure and the thermal expansion coefficient between the substrate 110 and the stacked layers disposed thereon through disposing the nucleation layer 120 and the buffer layer 330, and the semiconductor device 600 of the present embodiment may therefore obtain more optimized reliability and device performance.

Figure 11:
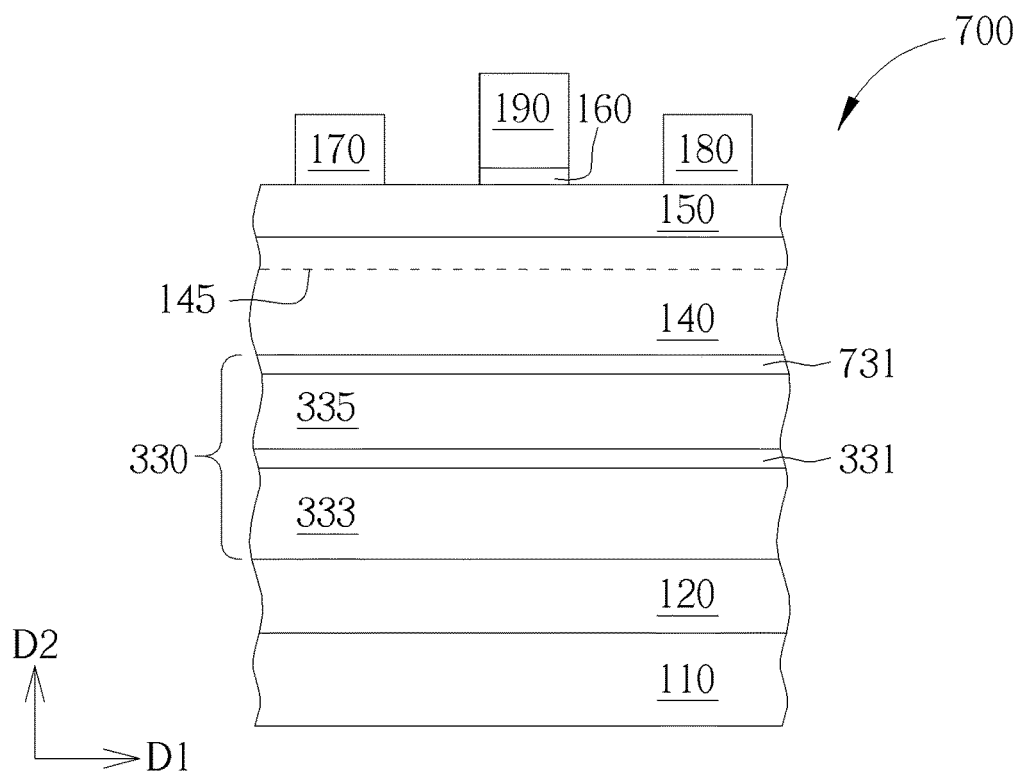
FIG. 11 is a schematic diagram illustrating a cross-sectional view of a semiconductor device according to a fifth embodiment in the present disclosure.

Please refer to FIG. 11, which illustrates a cross-sectional view of a semiconductor device 700 according to the third embodiment of the present disclosure, in which, the detailed materials of the superlattice layers are omitted for clearly illustrating the arrangement of the superlattice layers. The structure of the semiconductor device 700 is substantially similar to that in the aforementioned embodiment shown in FIG. 10 and which also includes the substrate 110, the nucleation layer 120, the channel layer 140, the barrier layer 150, the P-type III-V composition layer 160, the source electrode 170, the drain electrode 180, and the gate electrode 190. All similarity between the present embodiment and the aforementioned embodiment will not be redundant described hereinafter. The difference between the present embodiment and the aforementioned embodiment is in that a plurality of the first superlattice layer 331 is disposed within the buffer layer 330.

Figure 12:
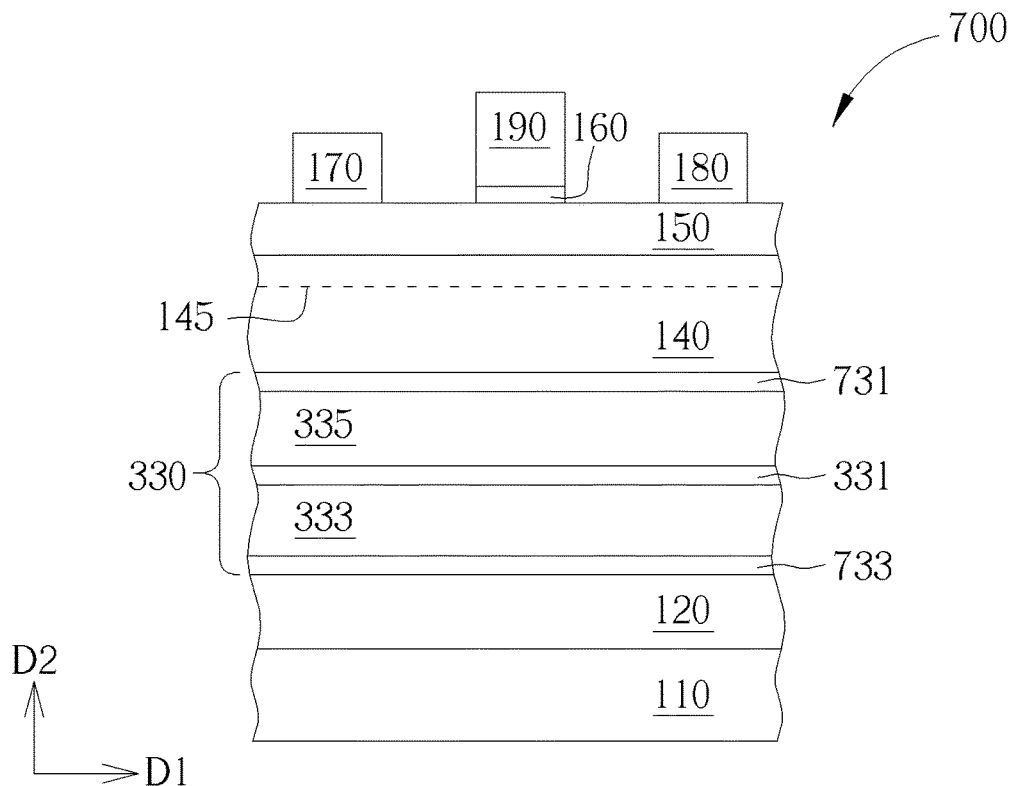
FIG. 12 is a schematic diagram illustrating a cross-sectional view of a semiconductor device according to another embodiment in the present disclosure.

Precisely speaking, a plurality of the first superlattice layer, such as the first superlattice layers 331, 731 as shown in FIG. 11, is disposed in the semiconductor device 700, wherein first superlattice layer 331 and the first superlattice layer 731 respectively includes the first materials and the second materials alternately arranged in the horizontal direction D1. It is noted that the detailed material selection and arrangement of the first materials and second materials are substantially the same as those described in the previous embodiments, which will not be redundantly described hereinafter. In the present embodiment, the second superlattice layer 333, the first superlattice layer 331, the third superlattice 335 and the first superlattice layer 731 are sequentially disposed on the nucleation layer 120. Accordingly, the first superlattice layer 331 and the first superlattice layer 731 may be respectively disposed at the middle portion and the top portion of the buffer layer, and the lattice defects in the stacked layers may also deviate laterally by two or more than two laterally arranged heteromaterials, thereby eliminating the lattice defects. Furthermore, people in the art should fully understand that the practical number of the first superlattice layers 331, 731 (e.g., two) and the detailed location thereof (e.g., the middle portion and top portion of the buffer layer 330) are not limited to the aforementioned type. In other embodiments, the first superlattice layers may also be disposed by other numbers, or be disposed at other locations. For example, in another embodiment, a plurality of the first superlattice layers (not shown in the drawings) may be disposed at the top portion and the bottom portion of the buffer layer 330 respectively, or a plurality of the first superlattice layers (not shown in the drawings) may be disposed at the middle portion and the bottom portion of the buffer layer 330 respectively, and also, a plurality of the first superlattice layers, such as the first superlattice layers 331, 731, 733 as shown in FIG. 12, may be disposed at the top portion, the middle portion and the bottom portion of the buffer layer 330 respectively.

Through these arrangements, the semiconductor device 700 of the present embodiment may also gradually improve the compatibility of the lattice structure and the thermal expansion coefficient between the substrate 110 and the stacked layers disposed thereon through disposing the nucleation layer 120 and the buffer layer 330, and the semiconductor device 700 of the present embodiment may therefore obtain more optimized reliability and device performance.

Figure 13:
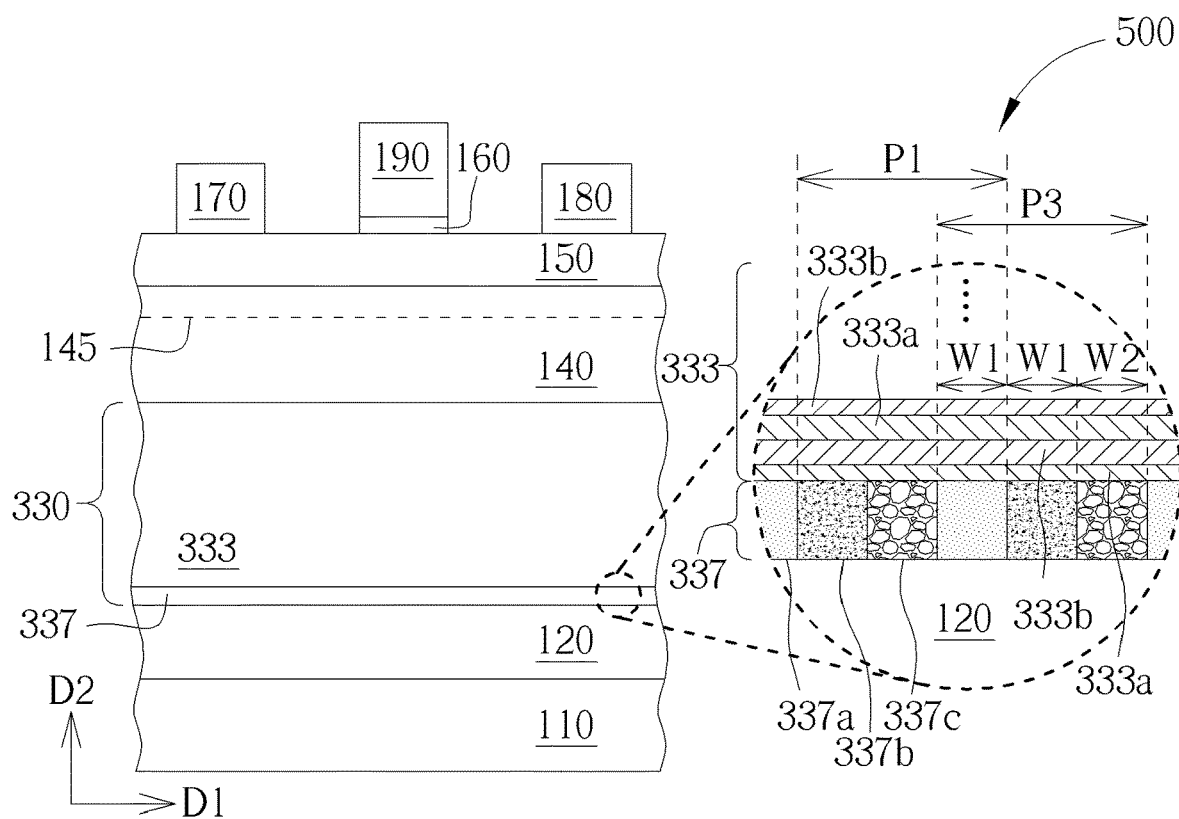
FIG. 13 is a schematic diagram illustrating a cross-sectional view of a semiconductor device according to another embodiment in the present disclosure.

It is noteworthy that, although the first superlattice layer (such as the first superlattice layers 331, 731, 733) and the second superlattice layer (such as the second superlattice layer 333, 335) are all exemplified by having two heteromaterials, the present disclosure is not limited thereto. People in the art should fully understand that the first superlattice layer (such as the first superlattice layers 331, 731, 733) and/or the second superlattice layer (such as the second superlattice layer 333, 335) may also include more than two heteromaterials optionally. For example, as shown in FIG. 13, in one embodiment, a first superlattice layer 337 may include a first material 337a, a second material 337b and a seventh material 337c sequentially and alternately arranged in the horizontal direction D1. The first material 337a, the second material 337b and the seventh material 337c for example include different III-V-nitride materials or III-nitride materials, and the first material 337a, the second material 337*b* and the seventh material 337*c* are disposed within the first superlattice layer 337 by repeating disposing the first material 337*a*, followed by the second material 337*b*, followed by the seventh material 337*c*. Precisely speaking, the first material 337*a*, and the second material 337*b* may include the same sized patterns, such as patterns with the same width W1, to arrange along the horizontal direction D1 by the same pitch P2, and the seventh material 337*c* may include different sized patterns, with the seventh material 337*c* for example including patterns with a different width W2, to arrange along the horizontal direction D1 by the same pitch P3, with the width W1, W2 being about 3 angstroms to 10 nanometers, but is not limited thereto. With these arrangements, the first superlattice layer may have more laterally arranged heteromaterials, and the lattice defects in the stacked layers may therefore deviate laterally to the horizontal direction D1, thereby more effectively preventing the upward transmission of lattice defects, and eliminating the lattice defects in the stacked layers.

Overall speaking, the buffer layer of the semiconductor device of the present disclosure simultaneously includes the heteromaterials alternately arranged in the horizontal direction, and the heteromaterials stacked in the vertically direction disposed therein, and also, the heteromaterials alternately arranged in the horizontal direction may be optionally disposed at the top portion, the bottom portion and/or the middle portion of the buffer layer. Through these arrangements, the possible lattice defects within the stacked layers may deviate along the horizontal direction by the laterally arranged heteromaterials, thereby preventing the lattice defects from being transmitted upwardly to damages the integrity and the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate;
   forming a nucleation layer on the substrate;
   forming a buffer layer on the nucleation layer, the buffer layer comprising:
   a first superlattice layer, having at least two materials alternately arranged in a first periodically ordered relation in a horizontal direction; and
   a second superlattice layer, having a plurality of first layers and a plurality of second layers alternately stacked in a second periodically ordered relation along a vertical direction, wherein the plurality of the first layers and the plurality of the second layers each is consisted of a single material, and each simultaneously overlays the at least two materials of the first superlattice layer;
   forming an active layer on the buffer layer; and
   forming a gate electrode on the active layer.

2. The method of forming the semiconductor device according to claim 1, wherein the forming of the first superlattice layer comprising:
   forming a first material layer on the nucleation layer;
   patterning the first material layer to forming a plurality openings, wherein the openings are separately disposed in the first material layer;
   forming a second material layer to fill in the openings; and
   performing a planarization process to remove the second material outside the openings.

3. The method of forming the semiconductor device according to claim 2, wherein the first material layer and the second material layer are respectively formed through a chemical deposition process, physical deposition process or an epitaxial growth process.

4. The method of forming the semiconductor device according to claim 2, wherein the first material layer and the second material layer comprise different materials which are selected from a group consisted of gallium nitride, aluminum nitride, indium nitride, aluminum gallium nitride, indium gallium nitride and indium aluminum gallium nitride.

5. The method of forming the semiconductor device according to claim 1, further comprising:
   forming a third superlattice layer having a plurality of third layers and a plurality of fourth layers vertically stacked in a third periodically ordered relation along the vertical direction, wherein the first superlattice layer is disposed between the second superlattice layer and the third superlattice layer.

6. The method of forming the high electron mobility transistor device according to claim 2, wherein the planarization process comprises a chemical mechanical polishing process.

* * * * *